(12) United States Patent
Lu et al.

(10) Patent No.: US 9,666,591 B2
(45) Date of Patent: *May 30, 2017

(54) NON-VOLATILE MEMORY WITH SILICIDED BIT LINE CONTACTS

(71) Applicant: Cypress Semiconductor Corporation, San Jose, CA (US)

(72) Inventors: Ching-Huang Lu, Fremont, CA (US); Simon Siu-Sing Chan, Saratoga, CA (US); Hidehiko Shiraiwa, San Jose, CA (US); Lei Xue, Saratoga, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/006,288

(22) Filed: Jan. 26, 2016

(65) Prior Publication Data

US 2016/0211271 A1   Jul. 21, 2016

Related U.S. Application Data

(60) Continuation of application No. 14/501,536, filed on Sep. 30, 2014, now Pat. No. 9,252,154, which is a
(Continued)

(51) Int. Cl.
*H01L 29/02* (2006.01)
*H01L 27/11568* (2017.01)
(Continued)

(52) U.S. Cl.
CPC .... *H01L 27/11568* (2013.01); *H01L 21/0214* (2013.01); *H01L 21/0228* (2013.01);
(Continued)

(58) Field of Classification Search
CPC ........... H01L 21/336; H01L 21/823456; H01L 29/40; H01L 29/78; H01L 29/7883; H01L 29/792; H01L 27/1157; H01L 27/11573
(Continued)

(56) References Cited

U.S. PATENT DOCUMENTS 4,688,078 A   8/1987   Hseih
6,642,111 B1  11/2003  Hsu et al.
(Continued)

FOREIGN PATENT DOCUMENTS

CN   1421917 A   6/2003

OTHER PUBLICATIONS

International Search Report for International Application PCT/US2014/013847 dated May 28, 2014; 3 pages.
(Continued)

*Primary Examiner* — Michael Lebentritt

(57) ABSTRACT

An approach to use silicided bit line contacts that do not short to the underlying substrate in memory devices. The approach provides for silicide formation in the bit line contact area, using a process that benefits from being self-aligned to the oxide-nitride-oxide (ONO) nitride edges. A further benefit of the approach is that the bit line contact implant and rapid temperature anneal process can be eliminated. This approach is applicable to embedded flash, integrating high density devices and advanced logic processes.

20 Claims, 14 Drawing Sheets

Related U.S. Application Data division of application No. 13/753,676, filed on Jan. 30, 2013, now Pat. No. 8,866,213.

(51) Int. Cl.

| | | |
|---|---|---|
| *H01L 21/28* | (2006.01) | |
| *H01L 29/66* | (2006.01) | |
| *H01L 29/792* | (2006.01) | |
| *H01L 21/02* | (2006.01) | |
| *H01L 21/265* | (2006.01) | |
| *H01L 21/3205* | (2006.01) | |
| *H01L 23/528* | (2006.01) | |
| *H01L 23/532* | (2006.01) | |
| *H01L 29/51* | (2006.01) | |
| *H01L 29/423* | (2006.01) | |

(52) U.S. Cl.
CPC ...... *H01L 21/02164* (2013.01); *H01L 21/265* (2013.01); *H01L 21/26513* (2013.01); *H01L 21/28282* (2013.01); *H01L 21/32053* (2013.01); *H01L 23/528* (2013.01); *H01L 23/53209* (2013.01); *H01L 23/53257* (2013.01); *H01L 29/4234* (2013.01); *H01L 29/513* (2013.01); *H01L 29/518* (2013.01); *H01L 29/6653* (2013.01); *H01L 29/66553* (2013.01); *H01L 29/66833* (2013.01); *H01L 29/792* (2013.01); *H01L 2924/0002* (2013.01)

(58) Field of Classification Search
USPC ........................................ 257/324
See application file for complete search history.

(56) References Cited

U.S. PATENT DOCUMENTS

| | | | |
|---|---|---|---|
| 6,744,105 B1 | 6/2004 | Chen et al. | |
| 6,808,991 B1 | 10/2004 | Tung | |
| 7,098,107 B2 | 8/2006 | Bloom et al. | |
| 7,319,613 B2 | 1/2008 | Forbes | |
| 7,602,067 B2 | 10/2009 | Ma et al. | |
| 7,629,641 B2 | 12/2009 | Bhattacharyya | |
| 7,973,366 B2 | 7/2011 | Ho et al. | |
| 8,263,458 B2 | 9/2012 | Chen et al. | |
| 8,349,685 B2 | 1/2013 | Hui et al. | |
| 8,462,557 B2 | 6/2013 | Bhattacharyya | |
| 8,652,907 B2 | 2/2014 | Lin et al. | |
| 8,653,581 B2 | 2/2014 | Cheng et al. | |
| 8,705,278 B2 | 4/2014 | Lue | |
| 8,866,213 B2 * | 10/2014 | Lu ..................... H01L 21/28282 257/321 |
| 9,252,154 B2 * | 2/2016 | Lu ..................... H01L 21/28282 |
| 2004/0043622 A1 | 3/2004 | Chen | |
| 2005/0029567 A1 | 2/2005 | Mori | |
| 2006/0240612 A1 | 10/2006 | Lee | |
| 2009/0004802 A1 | 1/2009 | Joo et al. | |
| 2009/0032864 A1 | 2/2009 | Inoue | |

OTHER PUBLICATIONS

USPTO Notice of Allowance for U.S. Appl. No. 13/753,676 dated Jun. 4, 2014; 8 pages.
USPTO Notice of Allowance for U.S. Appl. No. 13/753,676 dated Aug. 5, 2014; 1 page.
USPTO Notice of Allowance for U.S. Appl. No. 13/753,676 dated Aug. 6, 2014; 2 pages.
USPTO Notice of Allowance for U.S. Appl. No. 14/501,536 dated Mar. 18, 2015; 8 pages.
USPTO Notice of Allowance for U.S. Appl. No. 14/501,536 dated Sep. 30, 2015; 5 pages.
Written Opinion of the International Searching Authority for International Application PCT/US2014/013847 dated May 28, 2014; 9 pages.
International Search Report for International Application No. 14745500.0—1552/ 2951862, dated Oct. 21, 2016; 7 pages.
EPO Search Report for European Application No. 14745500.0, dated Feb. 3, 2017; 13 pages.

* cited by examiner

NON-VOLATILE MEMORY WITH SILICIDED BIT LINE CONTACTS

CROSS-REFERENCE TO RELATED APPLICATIONS

This application is a continuation of U.S. application Ser. No. 14/501,536, filed on Sep. 30, 2014, which is a Divisional Application of U.S. patent application Ser. No. 13/753,676, filed Jan. 30, 2013, now U.S. Pat. No. 8,866,213, issued Oct. 21, 2014, all of which are incorporated by reference herein their entirety.

BACKGROUND

Field

This invention relates generally to memory fabrication, and more particularly to a semiconductor processing method for flash memory fabrication.

Background Art

The semiconductor market has been undergoing extensive growth over the past few decades. This trend is expected to continue for the foreseeable future since a large portion of this market is the memory segment. The memory segment can be broadly categorized into two classes, namely volatile memory and non-volatile memory. Volatile memory such as SRAM and DRAM lose their data content when the power supply is removed. In contrast, non-volatile memories such as EEPROM and flash memories maintain their data content after the power supply has been removed.

Non-volatile memories offer particular advantages, and thereby support a wide range of applications including computer, automotive and consumer electronic devices. Flash memory is a non-voltage memory that can be electrically erased and reprogrammed. In fact, flash memory has undergone an explosive market growth that has in particular been driven by cellular telephones, memory cards, flash drives and other types of portable data storage devices. Indeed, with the need to support persistent data storage in portable devices, it is clear that the flash memory will continue to grow at an ever increasing rate. Further, the market place will demand flash memory designs that support lower cost and higher performance, including higher densities of storage.

The basic concept of a flash memory cell is that of a floating gate in a metal oxide semiconductor transistor. The floating gate serves as a charge storage layer, and a nitride layer can be used to form the floating gate. The electrical isolation of the floating gate is accomplished by surrounding the gate with dielectric material, such an oxide. Typically, flash memory cells use two oxide layers, a "bottom" oxide layer and a "top" oxide layer, to form a sandwich around the floating gate in the form of a dielectric stack. Because of the use of oxide layers and a nitride layer, the dielectric stack is commonly referred to as an oxide-nitride-oxide (or ONO) layer.

Data in the memory cell array is accessed by application of voltages to bit lines and word lines. The bit lines are formed on the semiconductor substrate and function as a source and a drain with an active channel region defined therebetween. The oxide-nitride-oxide (ONO) dielectric layer is formed on the top of the substrate and bit lines. The word lines are then formed on the top of the ONO layer, and perpendicular to the bit lines. Applying a voltage to the word line, which acts as a control gate, along with an applied voltage to the bit line allows for the reading or writing of data from or to that location in the memory cell array.

Between a predetermined number of word lines, conductive vias can traverse the dielectric stack to establish electrical contact to the bit lines. For bit lines made from n+-type conductivity silicon, sets of vias (one via for each bit line) can be placed at intervals of about eight to about sixteen word lines. To reduce the resistivity of the connections to the memory devices, metal silicides can be formed on the surface of electrically conductive structures (e.g., bit lines) of the memory devices.

BRIEF SUMMARY

While silicides are useful for reducing the resistivity in structures in memory devices, the formation of suicides can interfere with the operation of the devices due to undesirable substrate leakage. In particular, the requirement of small features with close spacing between adjacent features in high density memory devices requires a solution to the undesirable substrate leakage problem. In view of the foregoing, there is a need for a solution to the undesirable substrate leakage problem in silicided contact formation with small features with close spacing between adjacent features in high density memory devices. In particular, there is a need for such a solution in the formation of silicided bit line structures.

In one embodiment, a memory array is formed having a plurality of charge trapping dielectric memory devices. The charge trapping dielectric memory devices have a substrate with a first bit line and a second bit line formed therein and a body region interposed between the first and the second bit lines. The memory devices further have a first dielectric layer disposed on the body region, a dielectric charge trapping layer disposed on the first dielectric layer, and a second dielectric layer disposed on the dielectric charge trapping layer, the first dielectric layer and the dielectric charge trapping layer extending beyond the second dielectric layer in a direction parallel to a top surface of the substrate.

In one embodiment, a method is described that includes the steps of disposing a first dielectric layer on a substrate, disposing a dielectric charge trapping layer on the first dielectric layer, disposing a second dielectric layer on the dielectric trapping layer, patterning a hard mask on the second dielectric layer, disposing an oxide spacer on sidewalls of the hard mask to leave exposed a bit line contact region, removing portions of the second dielectric layer, dielectric trapping layer and first dielectric layer beneath the bit line contact region, removing portions of the oxide space sidewalls to leave exposed a portion of the second dielectric layer, and removing the exposed portion of the second dielectric layer to thereby yield extended portions of the dielectric trapping layer and first dielectric layer.

In one embodiment, a memory device is described that has a first dielectric layer disposed on a substrate, a dielectric charge trapping layer disposed on the first dielectric layer, and a second dielectric layer disposed on the dielectric charge trapping layer, the first dielectric layer and the dielectric charge trapping layer extending beyond the second dielectric layer in a direction parallel to a top surface of the substrate.

The features and advantages of the current invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
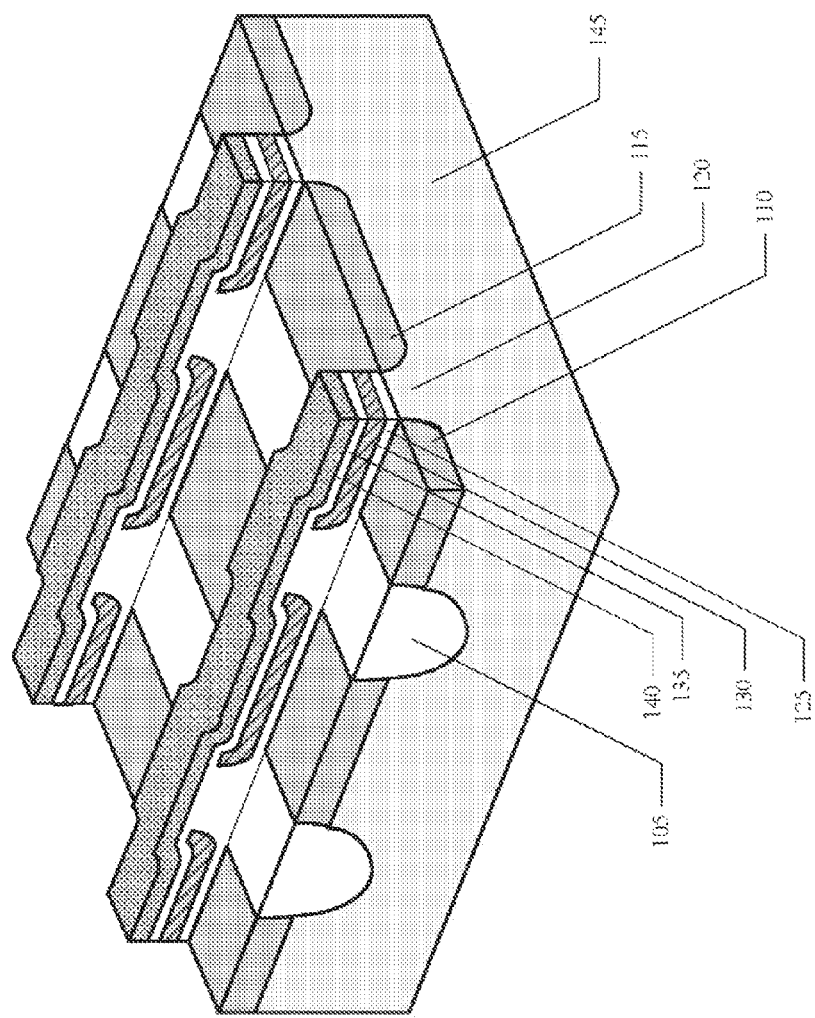
FIG. 1 illustrates a block diagram of a memory cell array structure, in accordance with an embodiment of the current invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 illustrates a block diagram of a memory cell array structure, in accordance with an embodiment of the current invention. Referring to FIG. 1, a memory cell array may be a charge-trapping NAND (CT-NAND) memory cell array 100. However, it is appreciated that embodiments of the present technology may be applied to any charge-trapping FET (CT-FET) device. In one implementation, each column of CT-FETs may be separated by a shallow trench isolation (STI) region 105. Each CT-FET may include a drain region 110, a source region 115, a channel region 120, a tunneling dielectric layer 125 (also commonly referred to as a bottom dielectric layer), a charge trapping layer 130, a blocking dielectric layer 135 (also commonly referred to as a top dielectric layer), and a gate region 140. The source and drain regions 110, 115 may be semiconductor regions of the substrate 145 having a heavy doping concentration of a first type of impurity. In one implementation, the source and drain regions 110, 115 may be silicon heavily doped with phosphorous or arsenic.

Persons of ordinary skill in the relevant arts will also recognize alternative materials can also be used, and fall within the scope of the current invention. The channel region 120 may be a semiconductor region of the substrate 145 having moderate doping concentration of a second type of impurity, disposed laterally between the source and drain regions 110, 115. In one implementation, the channel region 120 may be silicon moderately doped with boron. The tunneling dielectric layer 125 may be a dielectric layer disposed on the channel region 120 and adjacent portions of the source and drain regions 110, 115. In one implementation, the tunneling dielectric layer 125 may be silicon oxide, oxynitride, silicon oxynitride, or the like layer. The charge trapping layer 130 may be a dielectric, semiconductor or the like layer disposed between the tunneling dielectric layer 125 and the blocking dielectric layer 135. In one implementation, the charge trapping layer 130 may be a nitride, silicon-rich-nitride, or the like layer. The blocking dielectric layer 135 may be a dielectric layer disposed between the charge trapping layer 130 and the gate region 140. In one implementation, the blocking dielectric layer 135 may be a silicon oxide, oxynitride, silicon oxynitride, or the like layer. The gate region 140 may be a semiconductor or a conductor layer disposed on the blocking dielectric layer 135 opposite the charge trapping layer 130. In one implementation, the gate region 140 may be a polysilicon layer having a heavy doping concentration of the first type of impurity.

Although FIG. 1 illustrates a CT-NAND memory cell array, embodiments of the present invention apply equally well to other forms of flash memory, such as NOR flash memory (including floating gate and dual bit (sold under the trademark MirrorBit®) implementations). Subsequent illustrations will use a NOR flash memory cell array as an exemplary illustration of the various aspects of the present invention. As would be understood by one of ordinary skill in the art, aspects of the present invention can be directed to any situation involving the use of silicided contacts whereby extended adjacent layers can be used to provide superior spatial control of the formation of the silicided contacts.

Figure 2:
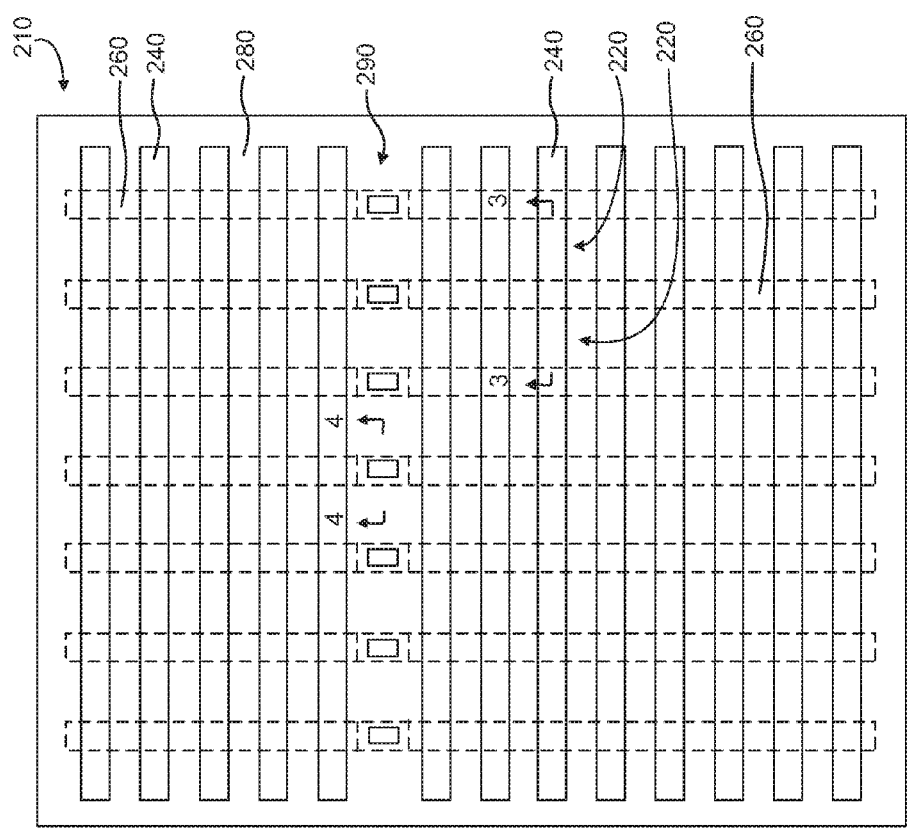
FIG. 2 illustrates a schematic block diagram of a portion of a memory array formed in accordance with an embodiment of the current invention.

FIG. 2 illustrates a top view schematic block diagram of a portion, or sector, of a memory array 210 that is used to form a memory unit. The memory array 210 can include a plurality of memory devices 220. The memory unit can also include a logic circuit (not shown) for use in controlling various operations (e.g., programming, reading and/or erasing) of the memory array 210. The memory unit can also include external (or static) references (not shown) for using in generating various reference currents, such as an erase verify reference, a soft-program verify reference and a program verify reference. As one skilled in the art will appreciate, the memory devices 220 can be used by a customer of the memory unit to store information, such as data or executable code.

The memory array 210 can include a plurality of word lines 240 (also referred to as gate lines) and bit lines 260. The word lines 240 are disposed on and separated from the bit lines 260 by a dielectric stack 280 in a grid arrangement (e.g., the word lines 240 are disposed in a transverse direction to the bit lines 260). The word lines 240, the bit lines 260 and the dielectric stack 280 are operatively arranged to form the memory devices 220. Although not described in great detail herein, some of the memory devices 220 can be used as dynamic reference devices to assist in reading the remaining memory devices 220 by tracking drift in threshold voltage of the memory devices 220 over multiple program/erase (P/E) cycles and aging of the memory unit.

Application of appropriate voltages to the word lines 240 and the bit lines 260 allows for the addressing of the memory devices 220 of the memory array 210 such that each memory device 220 can be programmed, read, verified and/or erased. Bit line contact assemblies 290 can be used to establish electrical connection to the bit lines 260 through the dielectric stack 280.

Figure 3:
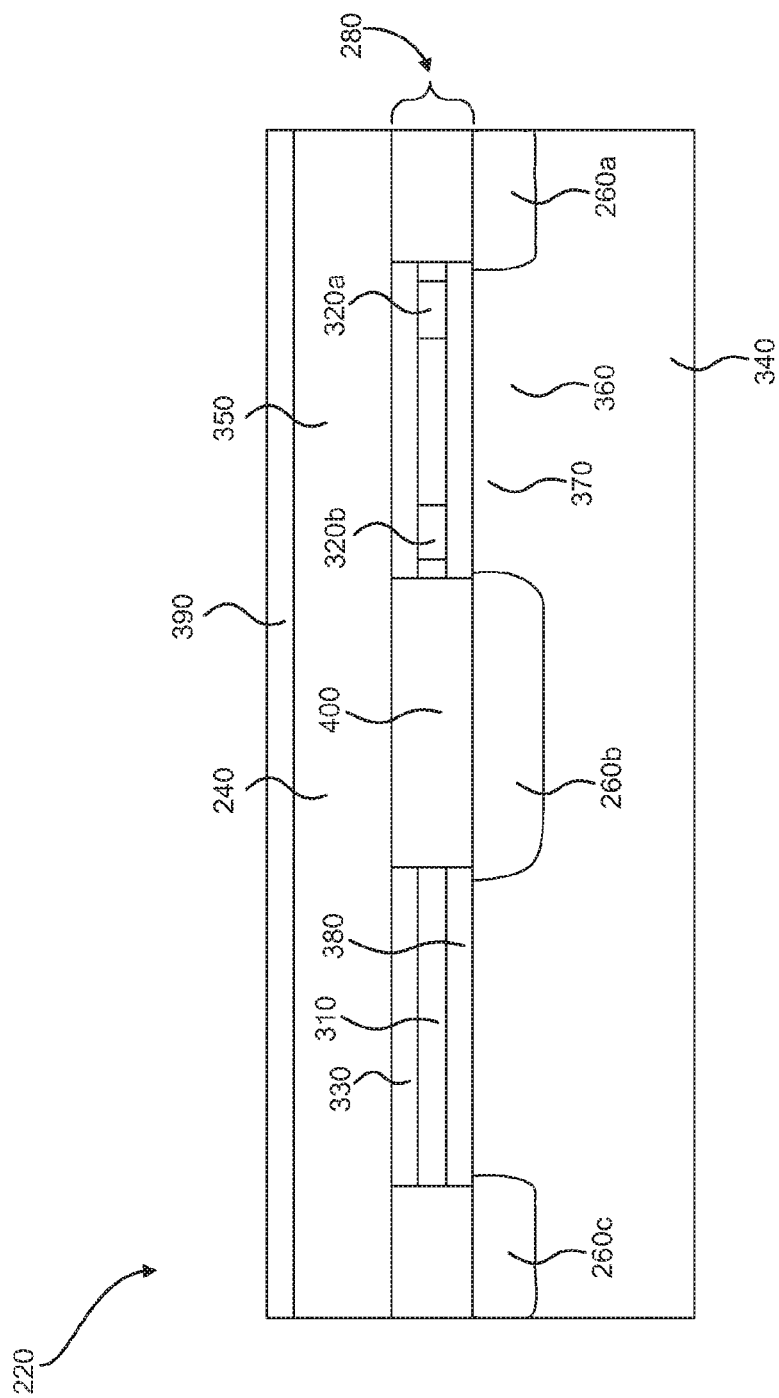
FIG. 3 illustrates a schematic cross-section illustration of exemplary memory devices from the memory array taken along the line 3-3 of FIG. 2.

FIG. 3 illustrates a cross-section of a portion of the memory array 210. It should be understood that the illustrated memory devices 220 are shown for exemplary purposes and can be implemented with alternative structures (e.g., stacked gate arrangement, recessed gate arrangement, etc.). The exemplary memory devices 220 are implemented as charge trapping dielectric type flash memory devices, each of which include a pair of complementary charge trapping regions 320a, 320b that can be independently programmed and read.

In the illustrated embodiment, the memory device 220 is fabricated on a semiconductor substrate 340 having p-type conductivity. In one embodiment, the substrate 340 can be formed from silicon (Si). Within the substrate 340, the bit lines 260a, 260b, 260c are formed in a buried bit line format. The bit lines 260a, 260b, 260c (which function as conductive regions) can be formed by implanting n-type dopant into the substrate 340. In one embodiment, the bit lines 260a, 260b, 260c have n+-type conductivity. Although not illustrated, a nitride layer can be formed at least partially on the bit lines 260a, 260b, 260c and p+-type pocket implants can be added adjacent the bit lines 260a, 260b, 260c.

For each memory device 220, adjacent pair of bit lines 260a, 260b. 260c form conductive regions that function as a source and a drain during various programming and reading operations. For each device, a body region 360 is disposed between the adjacent pairs of bit lines 260a, 260b, 260c.

Above the substrate 340 is the dielectric stack 280, also known as the ONO (oxide-nitride-oxide) layers. The dielectric stack 280 includes a bottom dielectric layer 380 (also referred to as a tunneling dielectric layer) that is made from, for example, silicon oxide (e.g., $SiO_2$) or other suitable material.

On top of the bottom dielectric layer 380 is a charge trapping layer 310 (also referred to as a charge storing layer). The charge trapping layer 310 can be made from, for example, a non-conductive dielectric material such as silicon nitride ($Si_3N_4$) or other suitable material.

On top of the charge trapping layer 310 is another dielectric layer (also referred to as a top dielectric layer 330) made from a material such as, for example, silicon oxide (e.g., $SiO_2$) or other suitable material. Alternative materials for the dielectric layers 380 and 330 can include high-K dielectric materials (e.g., dielectric materials having a relative permittivity greater than the relative permittivity of silicon oxide).

The word lines 240 are formed on the top dielectric layer 330. For each memory device 220, one of the word lines 240 functions as a gate electrode 350 that, in part, controls a channel 370 interposed between the adjacent pairs bit lines 260a, 260b, 260c. In alternative arrangements, the gate electrodes 350 can be formed from interconnected islands or pads. A work function of the word line 240 and the dielectric stack 280, in part, controls the channel 370 (e.g., inversion or depletion state) within the body region 360. Each word line 240 can include a highly conductive layer 390 formed on the upper surface of the word lines 240. For example, the conductive layer 390 can be formed from a silicide, such as $CoSi_x$.

Disposed on the bit lines 260, the dielectric stack 280 can include dielectric regions 400. Dielectric regions 400 can assist in filling voids formed in the tunnel dielectric layer 380, the charge trapping layer 310 and the top dielectric layer 330. The voids are formed as part of a method for fabricating the memory array and to assist in bit line 260 implantation by serving as bit line 260 implant windows.

Figure 4:
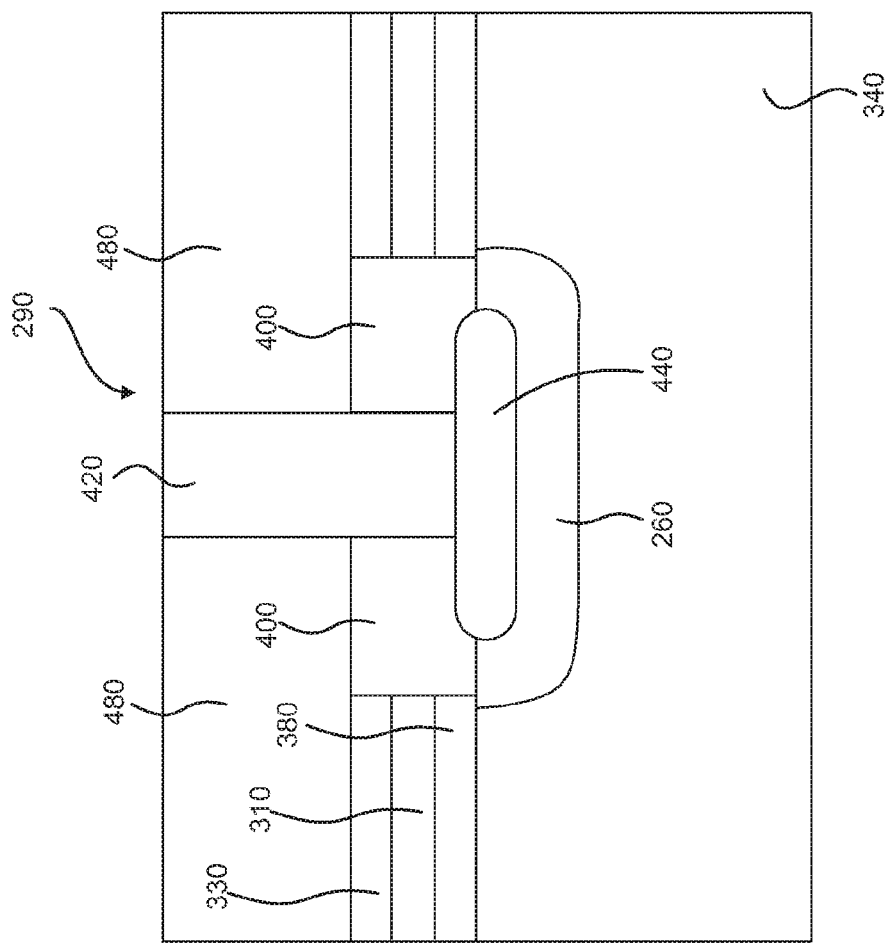
FIG. 4 illustrates a schematic cross-section illustration of an exemplary bit line contact region from the memory array taken along the line 4-4 of FIG. 2.

FIG. 4 illustrates a schematic cross-sectional view of an exemplary bit line contact region from the memory array 210. Each bit line contact region can include a bit line contact assembly 290 that can be used to establish electrical connection to the corresponding bit line 260 through the layer 400.

The bit line contact assembly includes a conductive via 420 that vertically traverses the dielectric region 400 for establishing election connection between an interconnect (not shown) and the bit line 260. The bit line contact assembly 290 can also include a metalized portion 440 of the bit line 260. The metalized portion 440 can be formed from a silicide material, such as the result of reacting a metal (e.g., cobalt, molybdenum, titanium, nickel, and the like) with the silicon of the bit line 260. This metalized portion 440 of the bit line 260 can reduce bit line 260 resistance (e.g., cobalt-silicon having a resistance of about five ohms/cm$^2$ to about twelve ohms/cm$^2$). Accordingly, sets of bit line contact assemblies 290 can be spaced apart by a higher number of word lines 240 than found in conventional memory arrays. For example, sets of bit line contact assemblies 290 (one bit line contact assembly 290 for each bit line 260) can be placed at placed at intervals of about 128 to about 256 word lines. In the illustrated embodiment, the metalized portions 440 extend vertically downward from an upper surface of the substrate 340 a distance less than the junction depth (described in greater detail below) of the bit lines 260. In another embodiment, the metalized portions 440 extend vertically downward from an upper surface of the substrate 340 a distance that coincides with the junction depth of the bit lines 260 or is deeper than the bit lines 260.

As will become more apparent from the discussion below, within the charge trapping layer 310, the memory device 220 includes the first charge trapping region 320a adjacent one of the conductive regions (e.g., the bit line identified as bit line 260a) and the second charge trapping region 320b (also referred to herein as a complementary cell, a left-hand bit or a second charge trapping region) adjacent the other of the conductive regions (e.g., the bit line identified as bit line 260b).

Each charge trapping regions 320a, 320b can independently have two data states. The data states can represent binary values such as a logical zero and a logical one. The logical one, for example, can be implemented by leaving the desired charge trapping region 320 in an unprogrammed state or blank program level. The logical zero, for example, can be implemented by storing an amount of charge in the desired charge trapping region 320. This condition is also referred to as a charged state, a programmed state, a programmed level or a charged program level.

In the illustrated embodiment, the memory device 220 is a structurally symmetrical device allowing for programming, verifying, reading and erasing of the first charge trapping region 320a and the second charge trapping region 320b by respectively switching the roles of the bit lines 260a and 260b (source and drain) during those operations. Therefore, the bit lines 260a, 260b will be referred to interchangeably by the terms source and drain, depending on the charge trapping region 320 of interest.

The individual cells of memory device 220 can be programmed as follows. The first charge trapping region 320a can be programmed to the charged program level by applying a voltage potential (e.g., about three volts to about six volts) to the bit line 260a (functioning as the drain) and a voltage potential (e.g., about eight volts to about ten volts) to the word line 240 (functioning as the gate electrode 350). The other bit line 260b functions as the source (i.e., source of electrons) for the channel hot electron programming of the charge trapping region 320a. In one embodiment, a bias voltage potential is also applied to the source (rather than grounding or floating the source as found in conventional charge trapping dielectric flash memory devices). As a result of the application of a bias potential to the source during programming, greater control over electron injection can be accomplished, which leads to enhanced data retention capability of the memory device 220.

The voltages applied to the gate electrode 350, the source and the drain generate a vertical electric field through the dielectric layers 380, 330 and the charge trapping layer 310 and a lateral electric field along the length of the channel 370 from the source to the drain. At a given threshold voltage, the channel 370 will invert such that electrons are drawn off the source and begin accelerating toward the drain. As the electrons move along the length of the channel 370, the electrons gain energy and upon attaining enough energy, the electrons are able to jump over the potential barrier of the bottom dielectric layer 380 and into the charge trapping layer 310 where the electrons become trapped. The probability of electrons jumping the potential barrier is a maximum in the area of the charge trapping region 320a adjacent the drain (i.e., bit line 260a), where the electrons have gained the most energy. These accelerated electrons are termed "hot electrons" and once injected into the charge trapping layer 310, tend to stay in the charge trapping region 390 of the charge trapping layer 310. The trapped electrons tend not to spread through the charge trapping layer 310 due to this layer's low conductivity and low lateral electric field therein. Thus, the trapped charge remains localized in the charge trapping region of the charge trapping region 320a close to the adjacent bit line 260a.

The foregoing technique to program the first charge trapping region 320a can be used to program the second charge trapping region 320b, but the functions of the bit lines 260a and 260b (i.e., source and drain) are reversed.

The individual cells of memory device 220 can be read as follows. Reading of the charge trapping regions 320 of the memory device 220 can be carried using, for example, a reverse read operation. For example, to read the first charge trapping region 320a, a voltage potential (e.g., about 1.3 volts to about two volts) can be applied to the conductive region opposite the first charge storing region 320a (i.e., bit line 260b, which is also referred to as the drain during read operations) and a voltage potential (e.g., about 4.5 volts to about 5.5 volts) can be applied to the word line 240 (function as the gate electrode 350). The conductive region adjacent the first charge storing region 320a (i.e., bit line 260a, which is also referred to as the source during read operations) can be grounded. To read the second charge trapping region 320b, the roles of the conductive regions can be reversed. The read operation drain voltage functions to mask, or "cover up," charge stored by the "unread" charge trapping region 320. During the read operation of the memory device 220 an amount of current drawn across the channel 370 can be compared against a reference current to determine the data state of the "read" one of the charge trapping regions 320.

As noted earlier, the demand for high density memory devices results in the requirement of small features with close spacing between adjacent features in high density memory devices. Bit line silicide contact regions are one of these small features, and it is required that these bit line silicide contact regions be formed without shorting or leaking to the substrate. Embodiments in accordance with the present invention use bit line oxide spacers to create an extended ONO foot, which prevents the bit line silicide contacts from shorting to the substrate. The silicide formation occurs only in the bit line contact region and is self-aligned to the ONO nitride edges. No bit line silicide can be formed between two neighboring word-lines because the lightly doped drain (LDD) spacer fills up the word-line spacing area.

Figure 5:
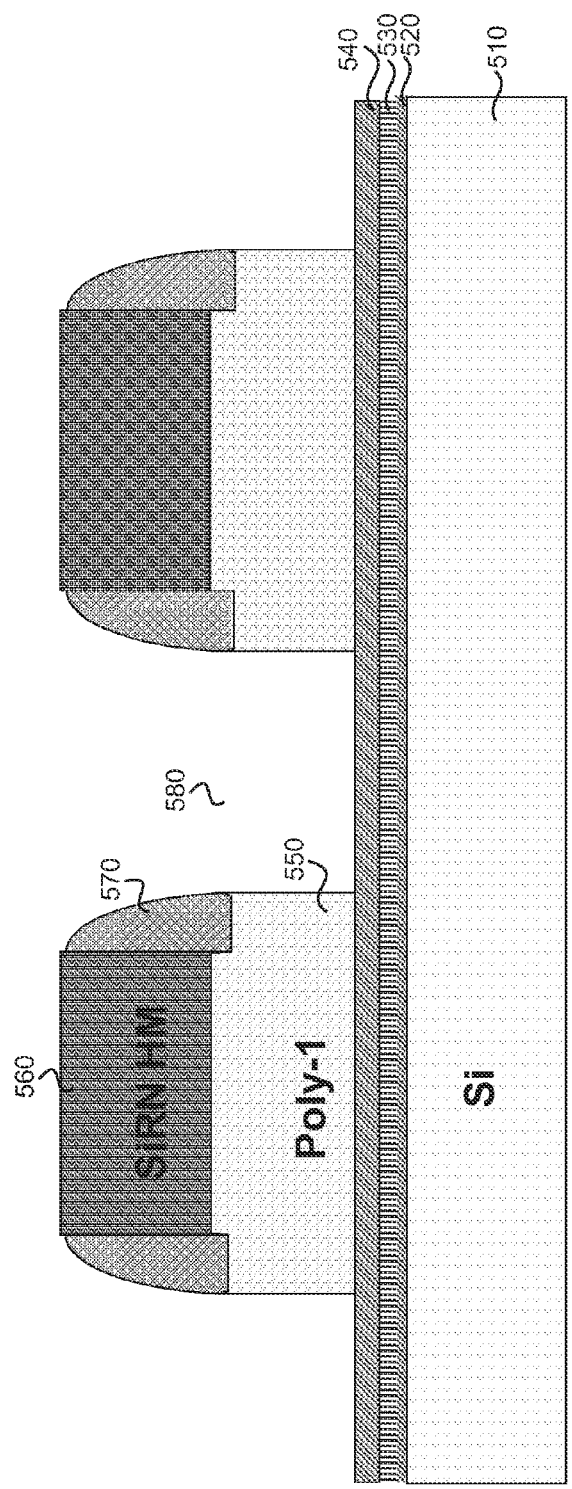
FIG. 5 illustrates a patterned SiRN hard mask and polysilicon layer, in accordance with an embodiment of the current invention.

FIG. 5 illustrates a partially formed memory device, in accordance with an embodiment of the present invention. At this stage of the semiconductor manufacturing process, the ONO layers 520, 530, 540 have been formed on the silicon substrate 510. Subsequent to the formation of the ONO layers 520, 530, 540, a poly-silicon layer 550 is formed on top of the ONO layers 520, 530, 540. Following the formation of the poly-silicon layer 550, a silicon-rich-nitride (SiRN) hardmask 560, 570 is deposited on the poly-silicon layer 550. The SiRN hardmask 560, 570 is patterned using conventional lithography and dry etch techniques, as understood by one of ordinary skill in the art. As can be readily inferred from FIG. 5, the poly-silicon layer 550 now contains a protected portion underneath SiRN hardmask 560, 570 and an unprotected portion (i.e., exposed poly-silicon layer) that is exposed to subsequent processing. Following the formation and patterning of the SiRN hardmask 560, 570, an appropriate poly-silicon etch is used to remove the exposed poly-silicon layer. The poly-silicon etch stops on the top oxide layer 540 of the ONO layers 520, 530, 540. Thus, the presence of SiRN spacer 570 is used to define the bit line opening for subsequent processing steps.

Figure 6:
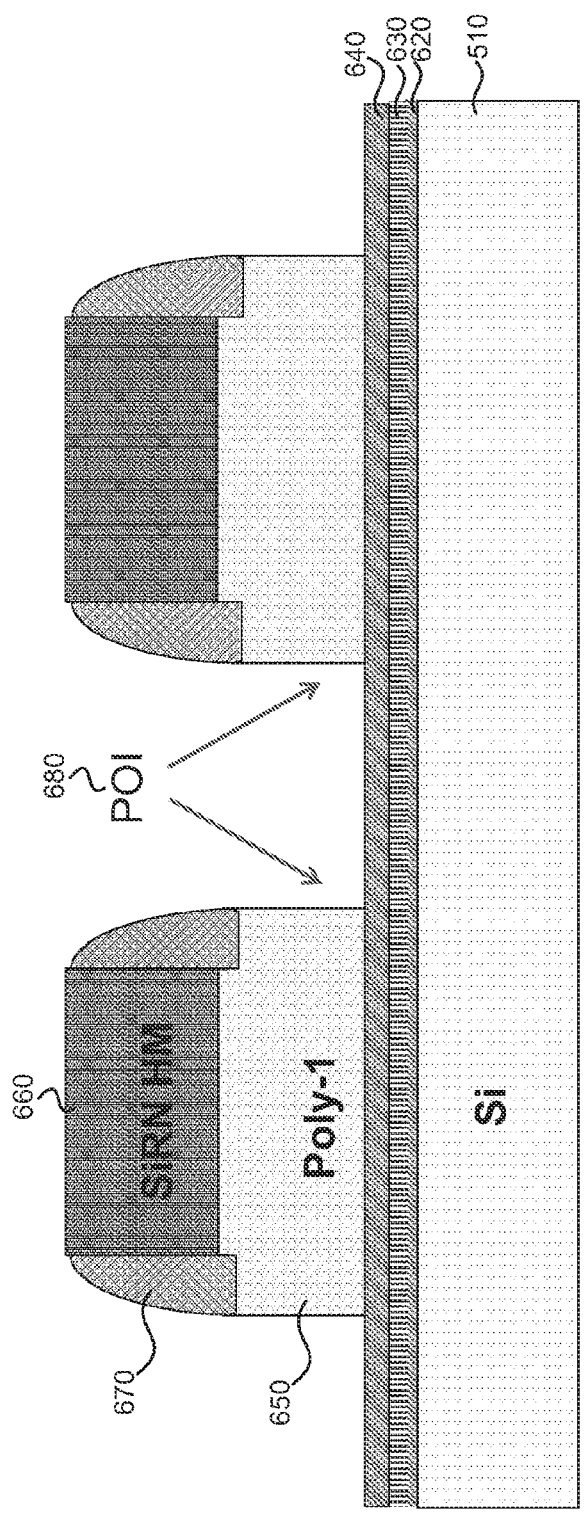
FIG. 6 illustrates the pocket impact and rapid thermal anneal process steps, in accordance with an embodiment of the current invention.

FIG. 6 illustrates the next step in the semiconductor manufacturing process, namely the pocket implant and annealing portion of the process. The first step involves the formation of pocket implants that are located in the semiconductor substrate under the side surfaces of the poly-silicon structures 550. Pocket implants enable control of threshold voltages of the memory cells. Pocket implants typically contain an implanted p-type material, such as boron. These pocket implants can be formed in the semiconductor substrate 510 by any suitable technique. For example, such dopants can be implanted at various energy levels, e.g., 3 keV to 30 keV, with doses in the range, e.g., $10^{12}$ atoms/cm$^2$ to $5\times10^{15}$ atoms/cm$^2$. The pocket implants can be formed using implantation of the dopant(s) at an angle with respect to the top surface of the semiconductor substrate 510. The dopants pass through the openings 580 between the poly-silicon structures 550 and are implanted adjacent to and to a certain degree under portions of the ONO layers 540, 530, 520 depending upon the angle of implantation. Dopants can be implanted at an angle of about 5 degrees or more and about 40 degrees or less relative to the surface of the semiconductor substrate 510. The resulting depth of implants in substrate 510 can be, for example, 15 nm. The dimensions, angles, energy levels and dopant types are exemplary, and are not limiting to the disclosure. Following the exemplary pocket implant process, a rapid thermal anneal (RTA) process is applied to anneal implant damages and to thereby suppress transient enhanced diffusion (TED).

Figure 7:
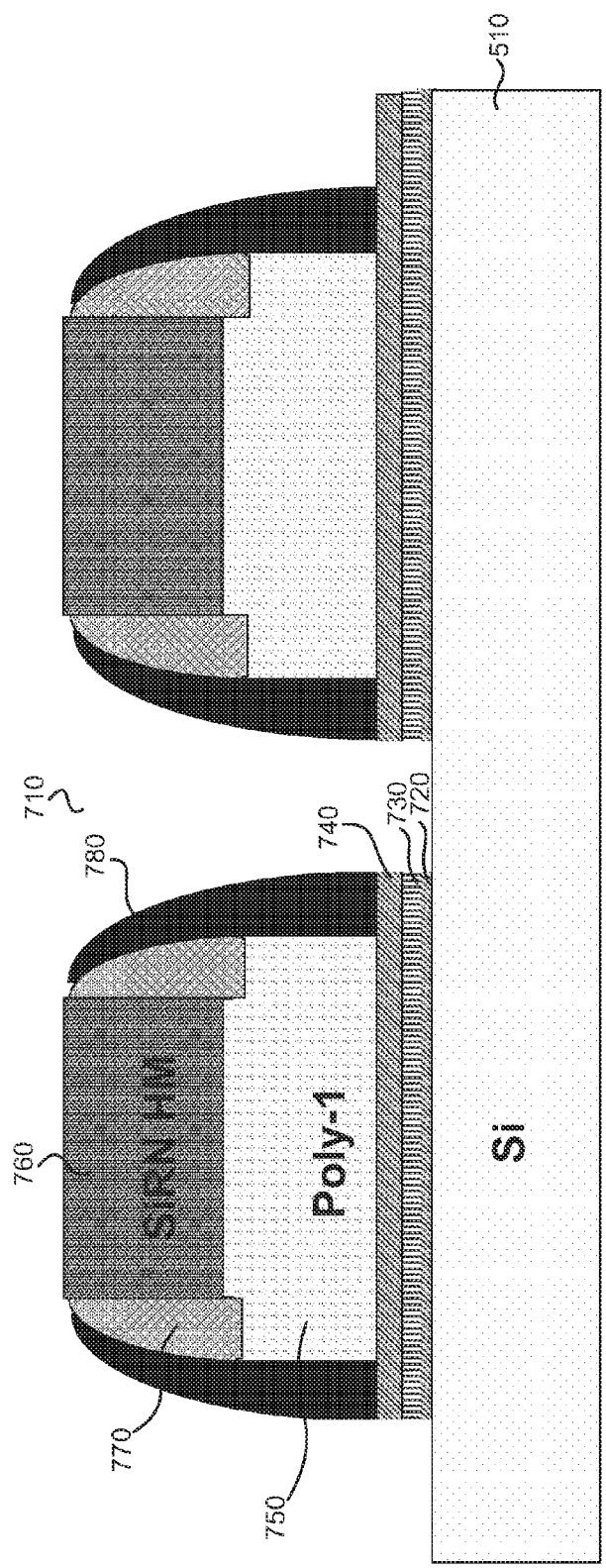
FIG. 7 illustrates the bit line oxide spacer deposition and ONO etch process steps, in accordance with an embodiment of the current invention.

FIG. 7 illustrates the next step in the semiconductor manufacturing process, namely the formation of spacers 780 adjacent the side surface of the features 770, 750 and on a portion of ONO layers 720, 730, 740. Spacers 780 serve as a mask when subsequently forming the bit lines and associated structures. Spacers 780 can contain any suitable material so that the spacers 780 can serve as a mask for protecting a covered portion (e.g., a covered portion of ONO layers 720, 730, 740) of the semiconductor substrate 510 when forming the bit lines and associated structures in the semiconductor substrate 510 in subsequent processes. In other words, the spacer material can be selected so that there is etch selectivity between the ONO layers 720, 730, 740 and semiconductor substrate 510 and spacer 780. Thus, the material of spacers 780 and semiconductor substrate 510 would have a lower etch rate than the ONO layers 720, 730, 740 in a subsequent etching process. For example, an etching rate of an oxide material or silicon material is substantially slower than an etching rate of the ONO layers 720, 730, 740 with respect to an ONO etchant. Accordingly, in one embodiment, spacers 780 contain an oxide material. Examples of oxides include tetraethylorthosilicate (TEOS) oxide, high temperature oxides (HTO), atomic layer deposition (ALD) and the like. Other examples of spacer materials could include nitrides (e.g., silicon nitride, silicon oxynitride, and silicon rich silicon nitride), silicates, diamond-like carbon, carbide, and the like. An ONO etch is used that stops on the SiRN hardmask 760 and spacer 780, but etches down through the ONO layers through to silicon substrate 510.

Figure 8:
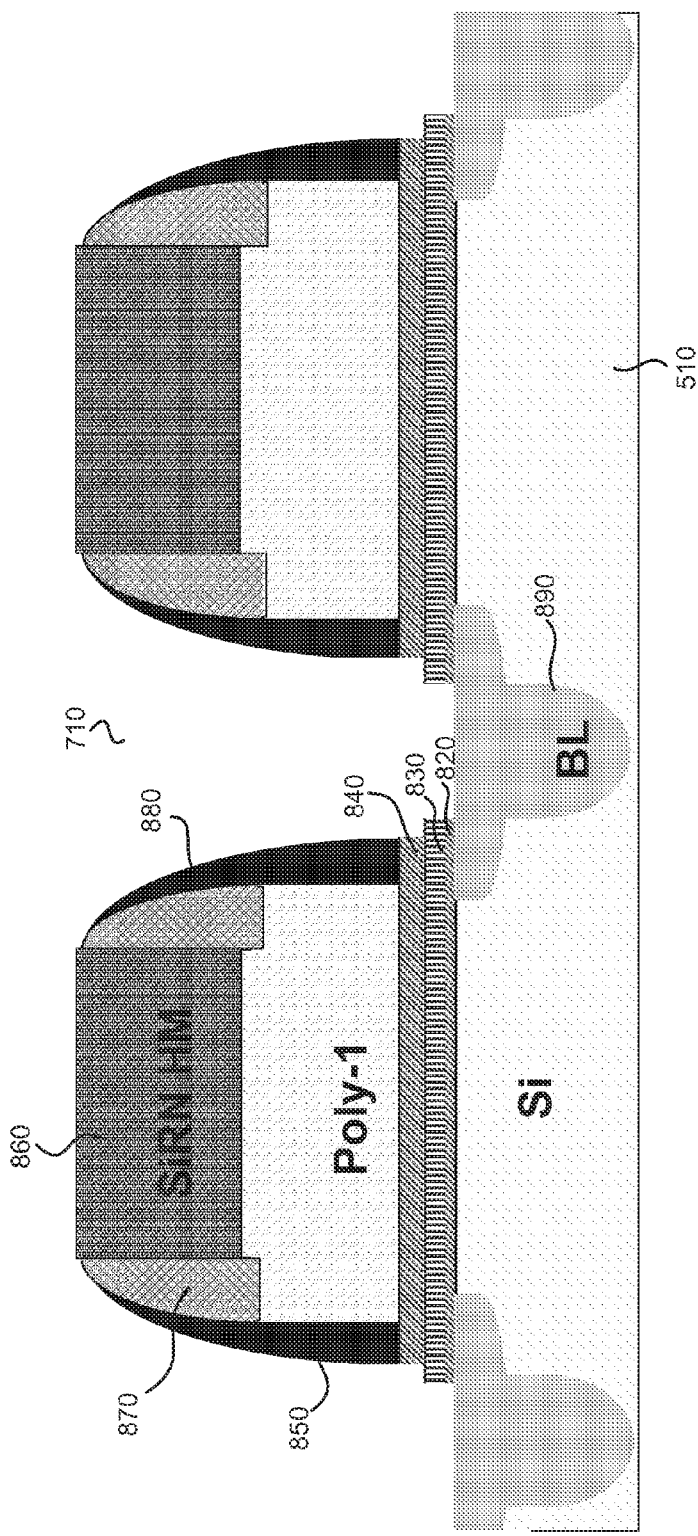
FIG. 8 illustrates the bit line implant and rapid thermal anneal process steps, in accordance with an embodiment of the current invention.

FIG. 8 illustrates the next steps in the semiconductor manufacturing process, as follows. After forming spacers 780, the bit line implant process takes place using three steps, two of these three steps involve bit line implants, while the third step is an intermediate etching step. With respect to the bit line implant steps, any suitable implant compositions and concentrations can be employed for the bit line implant region 890. For example, the bit line implant region 890 include one or more n-type dopants (e.g., arsenic, phosphorous, antimony). The dopants pass through the bit line opening 710 between the spacers 880 and are implanted into the semiconductor substrate 510 under the bit line opening 710. Thus, in the bit line implant process, SiRN hard mask 860 and spacers 880 can serve as an implant screen. That is, the spacer is used to offset the implants and spacers can constrain the implant into a narrower implant region.

With respect to first bit line implant process, spacers 880 can permit the use of higher energy and higher dose without suffering device short channel roll off issues. Spacers 880 can tolerate a higher energy bit line implant without resulting in too wide a bit line. A higher energy bit line implant can form deeper bit line junction and can effectively block the hot electron move to the adjacent cell and thereby prevent transient program disturbances (TPD). Transient program disturbances (TPD) are unwanted, and occur when hot electrons generated during programming a memory cell reach adjacent memory cells and disturb programming the adjacent memory cells. As noted above, the first bit line implant process typically uses an n-type material, such as arsenic, phosphorous, antimony, and the like. In an exemplary process step, an arsenic dopant can be implanted at various energy levels, e.g., 40 keV to 50 keV, with doses in the range, e.g., $1\times10^{15}$ atoms/cm$^{15}$ to $1.5\times10^{15}$ atoms/cm$^2$.

Following the first bit line implant process, the intermediate etching step is used to reduce the spacer 880 width prior to the second bit line implant process. In an exemplary process, an oxide wet etch can be used to reduce the thickness of the oxide spacer 880. In addition to reduce the thickness of the oxide spacer 880, the oxide wet etch will also commensurately etch back the top oxide layer 840 of the ONO stack 820, 830, 840.

Following the oxide wet etch, the second bit line implant process is applied. In contrast to the first bit line implant process, the second bit line implant process uses lower energy and therefore shallower, and also results in implantation beneath the extended NO layers 820, 830. Subsequent to second bit line implant process, a rapid thermal anneal (RTA) process is applied to repair implant damages and to thereby reduce the ill effects of transient enhanced diffusion (TED). As in the first bit line implant process, the second bit line implant process uses the same material, e.g., an n-type material, such as arsenic, phosphorous, antimony, and the like. In an exemplary method to provide the second bit line implant process step, an arsenic dopant can be implanted at various energy levels, e.g., 40 keV to 50 keV, with doses in the range, e.g., $1\times10^{15}$ atoms/cm$^2$ to $1.5\times10^{15}$ atoms/cm$^2$.

Figure 9:
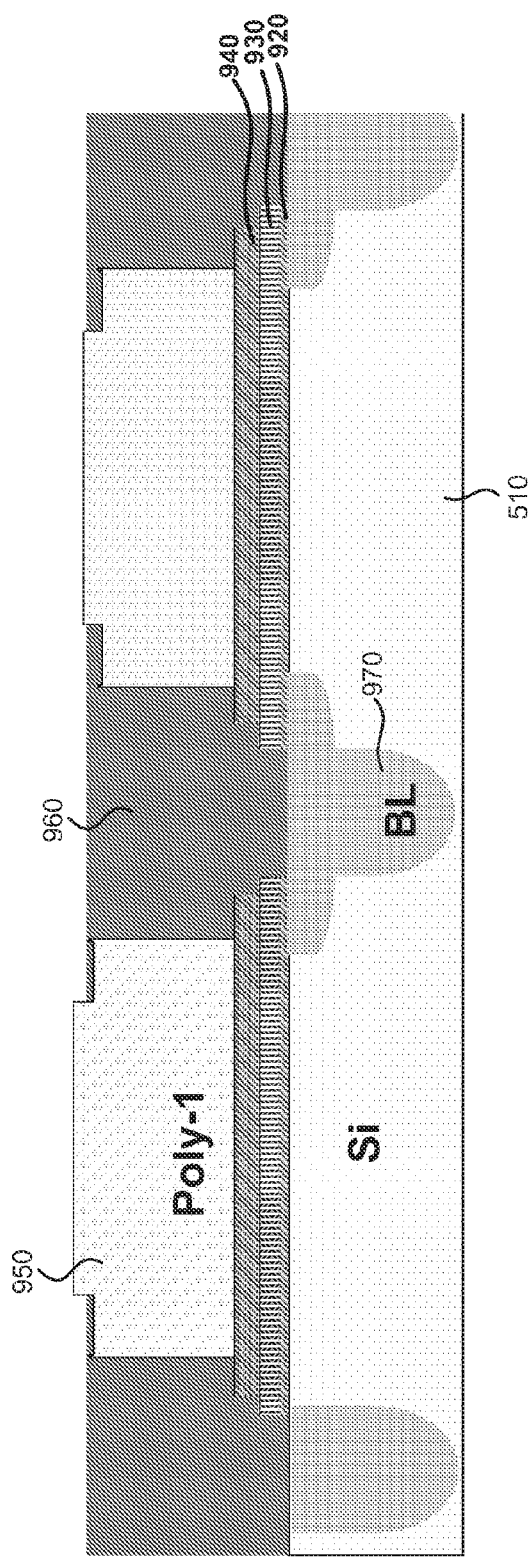
FIG. 9 illustrates the bit line oxide fill, polishing and hard mask etch process steps, in accordance with an embodiment of the current invention.

FIG. 9 illustrates the next step in the semiconductor manufacturing process, namely forming a bit line dielectric layer 960 on the semiconductor substrate 510. The bit line dielectric layer 960 can contain any suitable dielectric material such as oxides. Examples of oxides include high density plasma (HDP) oxide, as well as other oxide deposition techniques. In one embodiment, the bit line dielectric layer contains the same material as the spacer 880. Excess upper portions of the bit line dielectric layer 960 can be removed by any suitable technique. For example, the upper portion of the bit line dielectric layer 960 can be removed by chemical-mechanical polishing (CMP).

The spacer 880 may or may not be removed before forming a bit line dielectric layer 960. In one embodiment, the spacer is not removed before forming the bit line dielectric layer 960. When spacer 880 is not removed, the bit line opening 710 contains at least a portion of the spacer 880. In another embodiment, the spacer 880 is removed before forming a bit line dielectric layer. When the spacer 880 is removed, the bit line opening 710 does not contain spacers. For embodiments where the spacer 880 is removed, any suitable technique can be used. For example, the spacer 880 can be removed by etching.

Still referring to FIG. 9, FIG. 9 illustrates the memory device after removing the SiRN hard mask 860 and removing an upper portion of the bit line dielectric layer 960, thereby forming a bit line dielectric 950 in the bit line opening 710. The SiRN hard mask 860 can be removed by any suitable technique. For example, SiRN hard mask 860 can be removed by any suitable nitride etchant that does not substantially affect or damage the integrity of other layers in the memory device such as the poly layer 950. Examples of nitride etchants include phosphoric acid. Other nitride etchants can also be used as long as they are capable of removing the SiRN hard mask 860 selective to other layers.

Figure 10:
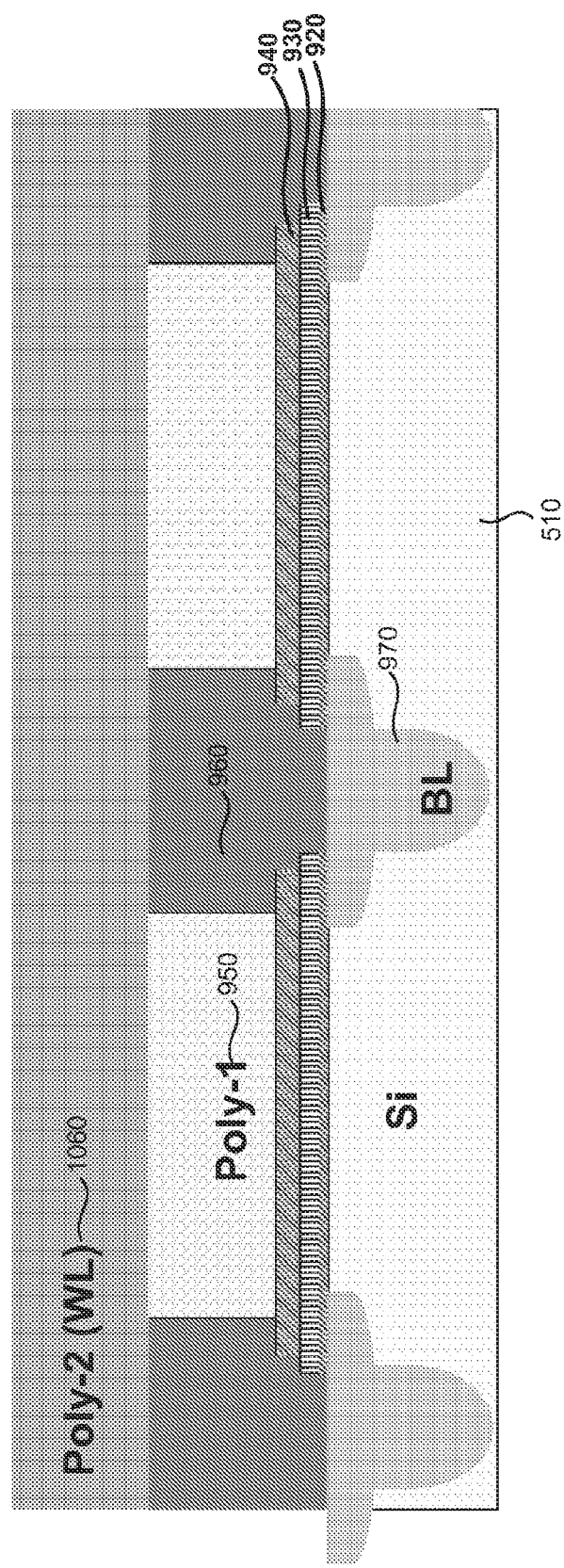
FIG. 10 illustrates the formation of word line and LDD spacer process steps, in accordance with an embodiment of the current invention.

FIG. 10 illustrates the next step in the semiconductor manufacturing process, namely forming a word line 1060 on the semiconductor substrate 510, thereby forming the desired memory cells. The word line 1060 can contain any suitable conductive material such as polysilicon. The word line 1060 can be formed by, for example, forming a layer of word line material on the substrate-in-progress and patterning (e.g., etching) the layer using a deposited hard mask to establish the word line 1060 on the bit lines 970. The bit lines 970 and the word line 1060 can be oriented at substantially right angles relative to one another. Lightly doped drain (LDD) spacers (not shown) that separate word lines 1060 are formed by oxide/nitride deposition and an appropriate etch.

Figure 11:
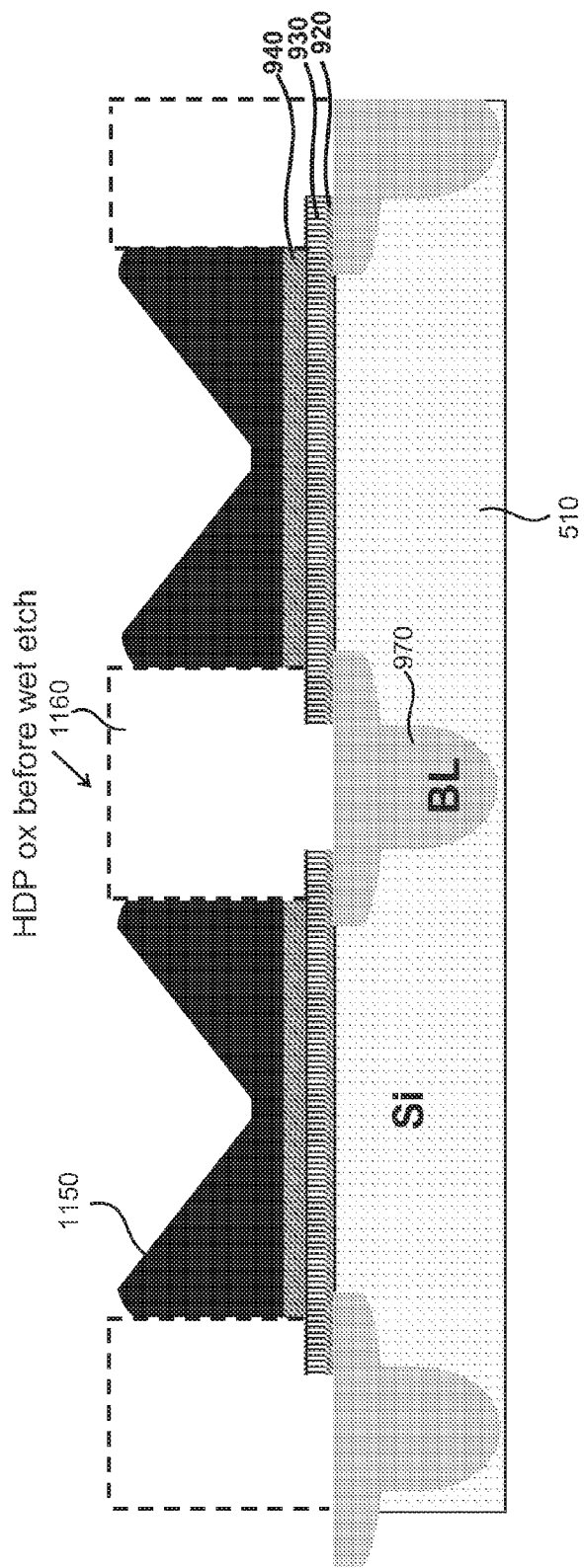
FIG. 11 illustrates the oxide wet etch process and bit line contact area formation process steps, in accordance with an embodiment of the current invention.

FIG. 11 illustrates the next step in the semiconductor manufacturing process, namely the initial steps in the formation of the silicided bit line contacts. Bit line oxide 1160 (e.g., high density plasma oxide) is etched using either a blanket wet etch or a wet etch process using a mask that opens up the bit line contact area above the bit line implant region 970. The wet etch can be an oxide wet etch that is highly selective to nitride. When using such a wet etch, the extended foot of nitride layer 930 remains intact, or in a worst case, is etched only a relatively small amount.

Figure 12:
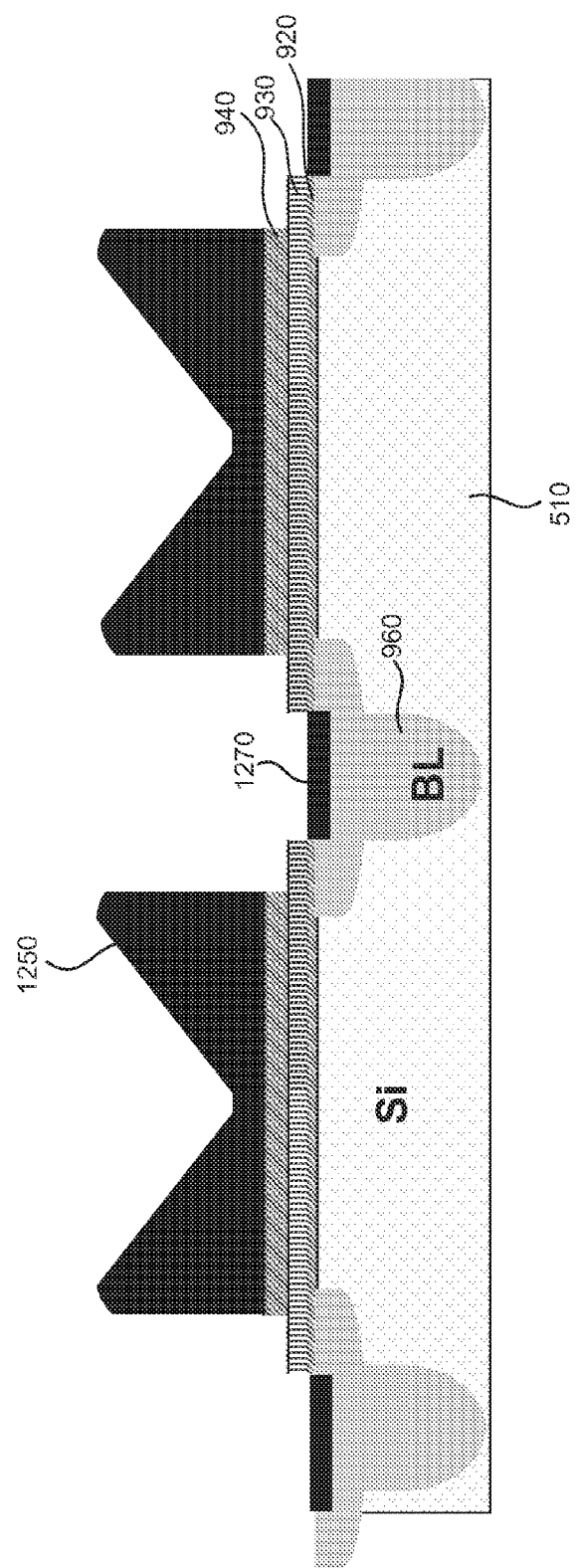
FIG. 12 illustrates a silicide formation in the bit line contact area, in accordance with an embodiment of the current invention.

FIG. 12 illustrates the next step in the semiconductor manufacturing process, namely the silicide formation in the bit line contact area. The contact area is prepared by application of a diluted hydrofluoric acid (DHF). Following the application of DHF, silicide metals (e.g., cobalt, molybdenum, titanium, nickel and the like) are deposited and silicide 1270 is formed in the bit line contact area. As FIG. 12 illustrates, the lateral edges of silicide 1270 are defined by the ONO foot nitride layer 930. Unreacted silicide metals are removed during a subsequent cleaning step. No silicide is formed in the bit line area between two word lines due to the LDD nitride covering. Thereafter, the bit line contact areas can optionally be filled, or partially filled, with an insulating material (e.g., silicon oxide) to reduce the size of the openings to these contact areas. Within the filled openings, a hole can be opened (if not already opened) that can be filled with a conductive material (e.g., a metal or metal containing material) to form the vias (not shown) for coupling to external connections.

Figure 13:
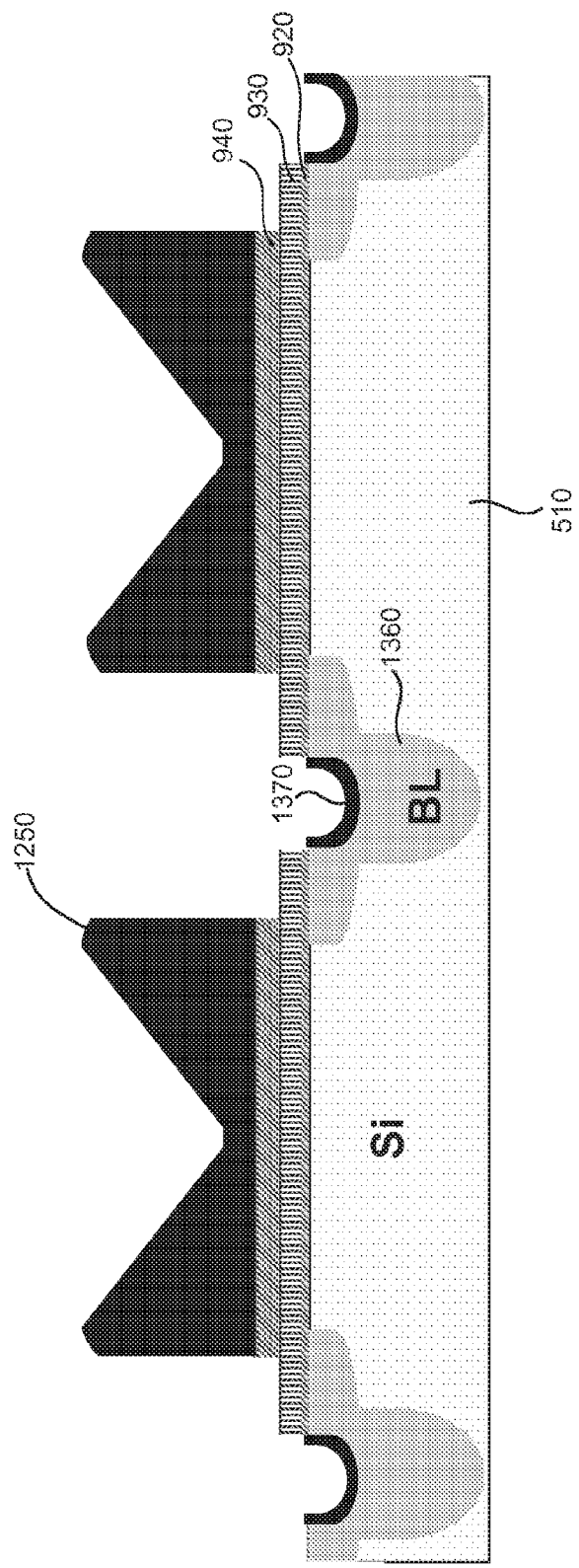
FIG. 13 illustrates a silicide formation in the bit line contact area having a trench, in accordance with an embodiment of the current invention.

FIG. 13 illustrates an alternate embodiment, wherein the silicide formation is applied to memory cells with bit line contact areas in the form of a trench. Bit line contact area 1360 is shown with a trench into which silicide 1370 is deposited.

In summary, the silicide formation is confined to the required bit line contact area. The silicide formation cannot extend beyond that area as it is self-aligned to the ONO nitride edges. The extended ONO foot is created by the bit line oxide spacer process. The extended ONO foot prevents shorting of the silicide to the underlying substrate.

Further, using silicide, bit line contact resistance and variation can be greatly reduced. The above process also eliminates the need for bit line contact implant and rapid thermal anneal (RTA) process steps, thereby simplifying the overall semiconductor process.

Finally, embodiments of the above invention are equally applicable to embedded flash memory products, integration of high density non-volatile memory, as well as advanced logic processes. Further, embodiments of the above invention are compatible with nickel silicide logic process because no rapid thermal anneal in the contact process is required.

Figure 14:
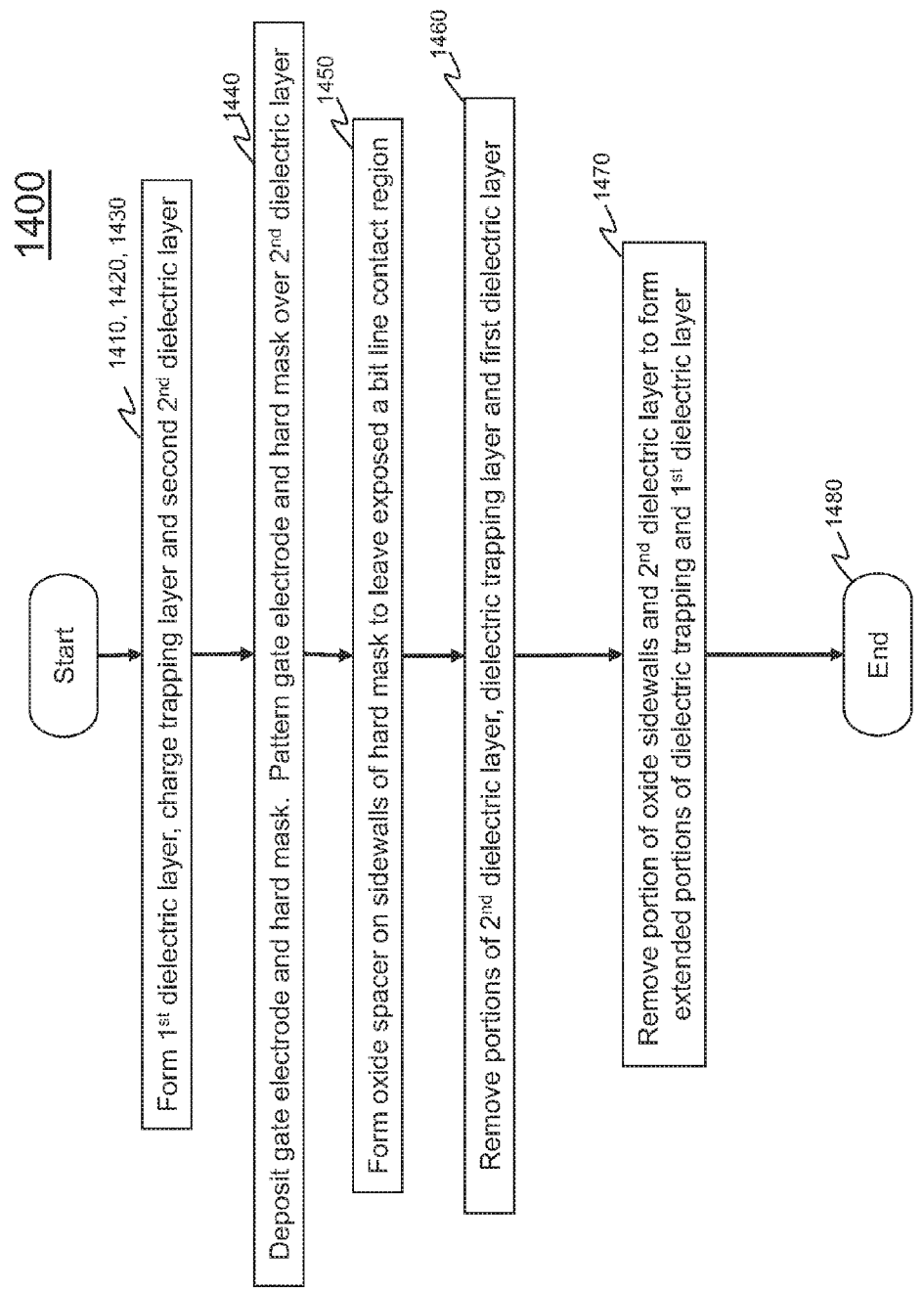
FIG. 14 illustrates a method of fabrication of a memory flash memory cell structure with an extended nitride-oxide layer to prevent leakage of silicide bit line contacts, in accordance with an embodiment of the current invention.

FIG. 14 provides a flowchart of a method 1400 that fabricates a memory flash memory cell structure with an extended nitride-oxide layer to prevent leakage of silicide bit line contacts, according to an embodiment of the current invention.

The process begins at step 1410. In step 1410, first dielectric layer is formed on substrate. In an exemplary embodiment, first dielectric layer 520 is formed on substrate 510.

In step 1420, dielectric charge trapping layer is formed on the first dielectric layer. In an exemplary embodiment, dielectric charge trapping layer 530 is formed on first dielectric layer 520.

In step 1430, second dielectric layer is formed on the dielectric trapping layer. In an exemplary embodiment, second dielectric layer 540 is formed on dielectric trapping layer 530.

In step 1440, a gate electrode and a hard mask are deposited. Next, the gate electrode and the hard mask are patterned on the second dielectric layer. In an exemplary embodiment, gate electrode 350 and hard mask 560, 570 are patterned on second dielectric layer 540.

In step 1450, an oxide spacer is formed on the sidewalls of the hard mask to leave exposed a bit line opening. In an exemplary embodiment, oxide spacer 780 is formed on the sidewalls of hard mask 560, 570 to leave exposed a bit line opening 710.

In step 1460, portions of the second dielectric layer, dielectric trapping layer and first dielectric layer beneath the bit line opening are removed. In an exemplary embodiment, portions of second dielectric layer 740, dielectric trapping layer 730 and first dielectric layer 720 are removed.

In step 1470, portions of the oxide spacer sidewalls and second dielectric layer are removed thereby form extended portions of the dielectric trapping and the first dielectric layer. In an exemplary embodiment, portions of oxide spacer sidewalls 880 and second dielectric layer 840 are removed to thereby form extended portions of dielectric trapping layer 830 and first dielectric layer 820.

At step 1480, method 1400 ends.

It is to be appreciated that the Detailed Description section, and not the Summary and Abstract sections, is intended to be used to interpret the claims. The Summary and Abstract sections may set forth one or more but not all exemplary embodiments of the current invention as contemplated by the inventor(s), and thus, are not intended to limit the current invention and the appended claims in any way.

The current invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the current invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the current invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A memory device comprising:
   a first dielectric layer disposed on a substrate;
   a charge trapping trapping layer disposed on the first dielectric layer;
   a second dielectric layer disposed on the charge trapping layer;
   a bit line layer formed in the substrate in spaces in which portions of the second dielectric layer, the charge trapping layer, and the first dielectric layer are absent;
   a silicide formed in the bit line layer, the silicide having lateral edges defined by the charge trapping layer; and
   a bit line oxide disposed over the second dielectric layer, the bit line oxide exposing the bit line layer.

2. The memory device of claim 1, wherein the first dielectric layer comprises silicon dioxide.

3. The memory device of claim 1, wherein the charge trapping layer comprises silicon-rich nitride (SiRN).

4. The memory device of claim 1, wherein the second dielectric layer comprises silicon oxide.

5. The memory device of claim 1, wherein the silicide comprises at least one of titanium silicide, cobalt silicide, and nickel silicide.

6. The memory device of claim 1, wherein the silicide comprises a trench-like configuration.

7. The memory device of claim 1, wherein an etch rate of the second dielectric layer, the charge trapping layer, and the first dielectric layer is substantially higher than the etch rate of an oxide spacer forming spaces in the second dielectric layer, the charge trapping layer, and the first dielectric layer.

8. The memory device of claim 7, wherein the oxide spacer comprises at least one of tetraethylorthosilicate (TEOS) oxide, a high temperature oxide (HTO), or an atomic layer deposition (ALD)-formed oxide.

9. The memory device of claim 8, wherein the bit line dielectric layer comprises:
   a bit line contact region formed in the substrate; and
   a bit line implant region formed in the substrate within the bit line contact region.

10. The memory device of claim 9, wherein the bit line implant region comprises:
    a first bit line implant sub-region comprising an n-type dopant disposed at a first depth; and
    a second bit line implant sub-region comprising the n-type dopant disposed at a second depth, wherein the second depth is less than the first depth.

11. The memory device of claim 8 further comprising a word line oriented substantially at right angles to a bit line formed within the bit line contact region.

12. The memory device of claim 8, wherein the bit line layer is formed within a bit line contact region.

13. The memory device of claim 12, wherein the bit line dielectric layer comprises a high density plasma (HDP) oxide.

14. A memory array comprising:
    a first dielectric layer disposed on a substrate;
    a charge trapping layer disposed on the first dielectric layer;
    a second dielectric layer disposed on the charge trapping layer;
    a bit line layer formed in the substrate in spaces in which portions of the second dielectric layer, the charge trapping layer, and the first dielectric layer are absent;
    a silicide formed in the bit line dielectric layer, the silicide having lateral edges defined by the charge trapping layer; and
    a bit line oxide disposed over the second dielectric layer, the bit line oxide exposing the bit line layer.

15. The memory array of claim 14, wherein the first dielectric layer comprises silicon dioxide.

16. The memory array of claim 14, wherein the charge trapping layer comprises silicon-rich nitride (SiRN).

17. The memory array of claim 14, wherein the second dielectric layer comprises silicon oxide.

18. The memory array of claim 14, wherein an etch rate of the second dielectric layer, the charge trapping layer, and the first dielectric layer is substantially higher than the etch rate of an oxide spacer forming spaces in the second dielectric layer, the charge trapping layer, and the first dielectric layer.

19. The memory array of claim 18, wherein the oxide spacer comprises at least one of tetraethylorthosilicate (TEOS) oxide, a high temperature oxide (HTO), or an atomic layer deposition (ALD)-formed oxide.

20. The memory array of claim 14 further comprising a word line oriented substantially at right angles to a bit line formed within the bit line oxide exposed portion of the bit line layer.

* * * * *